(12) United States Patent
Yu (10) Patent No.: US 11,367,855 B2
(45) Date of Patent: Jun. 21, 2022

(54) DISPLAY PANEL AND DISPLAY DEVICE EACH HAVING SOLIDIFICATION INHIBITING LAYER SURROUNDING EACH SPACER INHIBITING SPREADING OF SEALANT TO THE SPACERS AND METHOD OF MANUFACTURING THE DISPLAY PANEL

(71) Applicant: BOE TECHNOLOGY GROUP CO., LTD., Beijing (CN)

(72) Inventor: Donghui Yu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 47 days.

(21) Appl. No.: 16/634,680

(22) PCT Filed: Jul. 4, 2019

(86) PCT No.: PCT/CN2019/094731
§ 371 (c)(1),
(2) Date: Jan. 28, 2020

(87) PCT Pub. No.: WO2020/024765
PCT Pub. Date: Feb. 6, 2020

(65) Prior Publication Data
US 2021/0217983 A1      Jul. 15, 2021

(30) Foreign Application Priority Data

Aug. 1, 2018   (CN) .......................... 201810862110.7

(51) Int. Cl.
*H01L 51/52* (2006.01)
*H01L 51/56* (2006.01)

(52) U.S. Cl.
CPC ........ *H01L 51/525* (2013.01); *H01L 51/5246* (2013.01); *H01L 51/56* (2013.01)

(58) Field of Classification Search
CPC .............. H01L 51/525; H01L 51/5246; H01L 51/5243; H01L 51/524
See application file for complete search history.

(56) References Cited

U.S. PATENT DOCUMENTS

2006/0055318 A1    3/2006  Baik et al.
2006/0076884 A1*   4/2006  Ahn .................... H01L 51/5246
                                                          313/504
(Continued)

FOREIGN PATENT DOCUMENTS

CN         101101883 A      1/2008
CN         201917747 U      8/2011
(Continued)

*Primary Examiner* — Michael Jung
(74) *Attorney, Agent, or Firm* — Dilworth & Barrese, LLP.; Michael J. Musella, Esq.

(57) ABSTRACT

A display panel and a method of manufacturing the same, a display device are provided. The display panel includes a first substrate and a second substrate disposed oppositely to each other, and a sealant, spacers and a solidification inhibiting layer arranged between the first substrate and the second substrate, the solidification inhibiting layer being provided between the sealant and the spacers, and configured to inhibit the spreading of the sealant to the spacer.

6 Claims, 4 Drawing Sheets

(56) References Cited

U.S. PATENT DOCUMENTS

| | | | |
|---|---|---|---|
| 2006/0226773 A1* | 10/2006 | Kim | H01L 27/3246 313/512 |
| 2007/0161149 A1* | 7/2007 | Lin | H01L 51/525 438/99 |
| 2012/0080671 A1* | 4/2012 | Niboshi | H01L 51/524 257/40 |
| 2014/0284590 A1* | 9/2014 | Nakazawa | G02B 5/223 257/40 |
| 2015/0185539 A1* | 7/2015 | Senokuchi | G02F 1/1339 349/58 |
| 2016/0004110 A1* | 1/2016 | Imai | G02F 1/1341 349/42 |

FOREIGN PATENT DOCUMENTS

| | | |
|---|---|---|
| CN | 106548987 A | 3/2017 |
| CN | 108962963 A | 12/2018 |
| KR | 1020020053426 A | 7/2002 |

\* cited by examiner

DISPLAY PANEL AND DISPLAY DEVICE EACH HAVING SOLIDIFICATION INHIBITING LAYER SURROUNDING EACH SPACER INHIBITING SPREADING OF SEALANT TO THE SPACERS AND METHOD OF MANUFACTURING THE DISPLAY PANEL

CROSS-REFERENCE TO RELATED APPLICATIONS

The present application claims priority of Chinese Patent application No. 201810862110.7, filed on Aug. 1, 2018, the contents of which is incorporated herein by reference in its entirety as a part of the present application.

TECHNICAL FIELD

At least one embodiment of the present disclosure relates to a display panel and a method of manufacturing the same, and a display device.

BACKGROUND

With the development of science and technology and the progress of society, application of electronic display products to people's daily life is becoming more and more extensive, and accordingly, people's requirements on the performance of the electronic display products are also becoming more and more high. However, taking a display panel included in an electronic display product as an example, overall performance of the display panel may often be affected when the display panel is packaged based on the design structure of the display panel itself, and this result in low yield of the display panel.

SUMMARY

At least one embodiment of the present disclosure provides a display panel, comprising: a first substrate and a second substrate provided oppositely to each other, and a sealant, spacers, and a solidification inhibiting layer between the first substrate and the second substrate. The solidification inhibiting layer is provided between the sealant and the spacers, and is configured to inhibit spreading of the sealant to the spacers.

For example, in the display panel provided by at least one embodiment of the present disclosure, the sealant comprises a polymerized organic material, and the solidification inhibiting layer is configured to inhibit the organic material in contact with the solidification inhibiting layer from being polymerized during solidification.

For example, in the display panel provided by at least one embodiment of the present disclosure, the sealant includes an epoxy-based organic material, and the solidification inhibiting layer includes at least one of sodium ions and potassium ions.

For example, the display panel provided by at least one embodiment of the present disclosure further comprises: a first electrode layer on the first substrate; an auxiliary electrode layer on a side of the second substrate facing the first substrate. The spacers are configured to electrically connect the auxiliary electrode layer with the first electrode layer.

For example, the display panel provided by at least one embodiment of the present disclosure further comprises: a plurality of organic light-emitting devices on the first substrate. The first electrode layer is a common driving electrode for the plurality of organic light-emitting devices.

For example, in the display panel provided by at least one embodiment of the present disclosure, each spacer comprises a first end and a second end opposite to the first end, the first end electrically contacting the first electrode layer, the second end electrically contacting the auxiliary electrode layer, and the spacers being provided between the first electrode layer and the auxiliary electrode layer.

For example, in the display panel provided by at least one embodiment of the present disclosure, the spacers are provided between the first electrode layer and the auxiliary electrode layer, the solidification inhibiting layer is provided on the first substrate, and provided on a side of the first electrode layer facing away from the first substrate.

For example, in the display panel provided by at least one embodiment of the present disclosure, the spacers are provided between the first electrode layer and the auxiliary electrode layer, the solidification inhibiting layer is provided on the second substrate, and provided on a side of the auxiliary electrode layer facing away from the second substrate.

For example, in the display panel provided by at least one embodiment of the present disclosure, the spacers are provided on the second substrate, and provided between the auxiliary electrode layer and the second substrate, a portion of the auxiliary electrode layer overlapping with each of the spacers protrudes toward the first substrate to be electrically connected with the first electrode layer.

For example, in the display panel provided by at least one embodiment of the present disclosure, the solidification inhibiting layer is provided on the second substrate, and provided on a side of the auxiliary electrode layer facing away from the second substrate.

For example, in the display panel provided by at least one embodiment of the present disclosure, the solidification inhibiting layer surrounds one end of each spacer.

For example, in the display panel provided by at least one embodiment of the present disclosure, the spacers are shaped as columns or truncated cones.

For example, in the display panel provided by at least one embodiment of the present disclosure, the sealant at least partially covers the organic light-emitting devices.

At least one embodiment of the present disclosure provides a display device, comprising the display panel.

At least one embodiment of the present disclosure also provides a method of manufacturing a display panel, comprising, providing a first substrate and a second substrate; forming spacers on the first substrate or the second substrate, and forming a solidification inhibiting layer on one side of the spacers; applying a sealant onto the first substrate or the second substrate; arranging the first substrate and the second substrate to be opposite to each other, so that the sealant, the spacers, and the solidification inhibiting layer are sandwiched between the first substrate and the second substrate; curing the sealant. The solidification inhibiting layer inhibits spreading of the sealant to the spacers.

For example, the manufacturing method provided by at least one embodiment of the present disclosure further comprises curing the sealant with ultraviolet light before the first substrate and the second substrate are arranged oppositely to each other. The sealant comprises a polymerized organic material, and the solidification inhibiting layer inhibits the organic material in contact with the solidification inhibiting layer from being polymerized during solidification.

For example, the manufacturing method provided by at least one embodiment of the present disclosure further comprises thermally curing the sealant, after the first substrate and second substrate are arranged oppositely to each other.

For example, in the manufacturing method provided by at least one embodiment of the present disclosure, the first substrate includes a first electrode layer formed thereon, the second substrate includes an auxiliary electrode layer formed thereon. The first substrate and the second substrate are arranged to be opposite to each other, so that the spacers electrically connect the auxiliary electrode layer and the first electrode layer.

For example, the manufacturing method provided by at least one embodiment of the present disclosure, the spacers and the solidification inhibiting layer are formed on one side of the first electrode layer away from the first substrate, each of the spacers is in contact with the first electrode layer and is electrically conductive, and after the first substrate and the second substrate are arranged oppositely to each other, one end of each spacer away from the first electrode layer contacts the auxiliary electrode layer; or the spacers and the solidification inhibiting layer are formed on one side of the auxiliary electrode layer away from the second substrate, each spacer contacts the auxiliary electrode layer and is electrically conductive, and after the first substrate and the second substrate are arranged oppositely to each other, each spacer contacts the first electrode layer; or each spacer is formed on the second substrate, next the auxiliary electrode layer is formed on the spacers, the solidification inhibiting layer is then formed on the auxiliary electrode layer, and after the first substrate and the second substrate are arranged oppositely to each other, a part of the auxiliary electrode layer overlapping with each spacer protrudes toward the first substrate to be electrically connected with the first electrode layer.

BRIEF DESCRIPTION OF THE DRAWINGS

To illustrate the technical solution of the embodiments of the present disclosure more clearly, the accompanied drawings of the embodiments will be briefly introduced below. It is apparent that the accompanied drawings as described below are only related to some embodiments of the present disclosure, but not limitative of the present disclosure.

DETAILED DESCRIPTION

Technical solutions of the embodiments will be described in a clearly and completely way in connection with the drawings related to the embodiments of the disclosure. Apparently, the described embodiments are just a part but not all of the embodiments of the disclosure. Based on the described embodiments herein, one of ordinary skill in the art can obtain other embodiment(s), without any creative labor, which shall be within the scope of the present disclosure.

Unless otherwise defined, all the technical and scientific terms used herein have the same meanings as commonly understood by one of ordinary skill in the art to which the present disclosure belongs. The terms, such as 'first,' 'second,' or the like, which are used in the description and the claims of the present disclosure, are not intended to indicate any sequence, amount or importance, but for distinguishing various components. The terms, such as 'comprise/comprising,' 'include/including,' or the like are intended to specify that the elements or the objects stated before these terms encompass the elements or the objects and equivalents thereof listed after these terms, but not exclude other elements or objects. The terms, 'on,' 'under,' 'left,' 'right,' or the like are only used to indicate relative position relationship, and when the absolute position of the object which is described is changed, the relative position relationship may be changed accordingly.

For example, the display panel includes two substrates disposed oppositely to each other, and the disposition opposite to each other of these two substrates needs to be achieved by, for example, a cell-assembling process. In addition, spacers are arranged between the two substrates to support spacing distance between the two substrates, to maintain the cell thickness of the display panel. Furthermore, a sealant may be filled between the two substrates, so as to stick the two substrates together and to further encapsulate the display panel. In the actual process, the press-bonding of the two substrates enables the sealant to expand toward the surroundings, and the sealant may diffuse onto the spacers, during packaging of the display panel. Namely, part of the sealant may be presented between the spacers and the substrates, and for example, the contact effect between layers, such as structural layers, or functional layers, disposed on a first substrate and on a second substrate, respectively, may be affected, thus affecting overall performance of the display panel and reducing yield of the display panel. For example, in the process of encapsulating the display panel by a cell-assembling process, the diffused sealant may hinder cell-assembling of the first substrate and the second substrate, and reduce yield of the cell-assembling process, thus reducing yield of the display panel.

According to at least one embodiment of the present disclosure, a display panel is provided, including: a first substrate and a second substrate disposed oppositely to each other, and a sealant, spacers and a solidification inhibiting layer arranged between the first substrate and the second substrate, the solidification inhibiting layer being located between the sealant and the spacers, and configured to inhibit the spreading of the sealant to the spacers. The solidification inhibiting layer can inhibit the spreading of sealant to the spacers, and in the process of encapsulating the display panel, the sealant will not cover the spacers, i.e., the sealant will not, for example, affect the contact effect between layers, such as structural layers, or functional layers, arranged on a first substrate and on a second substrate, respectively, so that the structural design of the display panel is improved. In this way, the overall performance of the display panel is enhanced, and yield of the display panel is increased. For example, during a process of cell-assembling the first substrate and the second substrate, the sealant will not cover the spacers, that is, the sealant will not hinder the cell-assembling of the first substrate and the second substrate, so that yield of the cell-assembling process is promoted. In this way, yield of the display panel is increased.

Hereinafter, a display panel and its manufacturing method, and a display device, in accordance with at least one embodiment of the present disclosure, will be described in conjunction with the drawings.

Figure 1A:
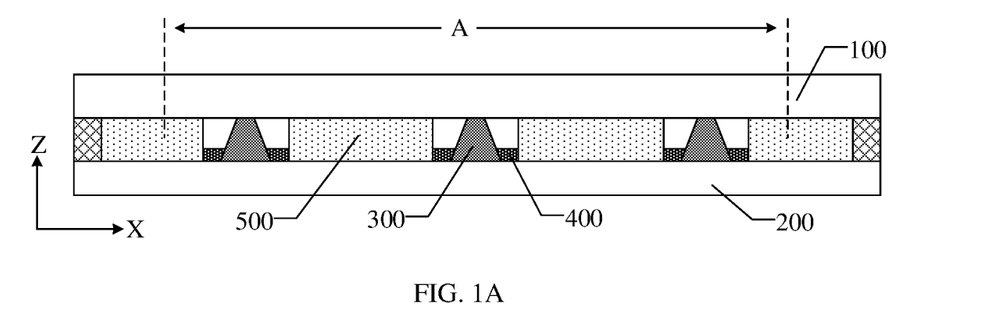
FIG. 1A is a sectional view of a display panel provided by some embodiments of the present disclosure.
Figure 1B:
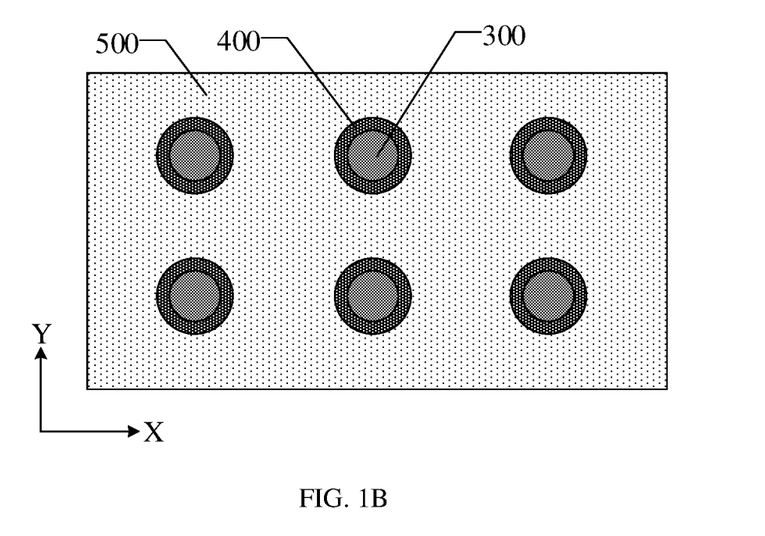
FIG. 1B is a plan view of an area A of the display panel shown in FIG. 1A.

FIG. 1A is a sectional view of a display panel provided by an embodiment of this disclosure, and FIG. 1B is a plan view of an area A of the display panel shown in FIG. 1A.

For example, in at least one embodiment of the present disclosure, as shown in FIG. 1A and FIG. 1B, the display panel includes a first substrate 100 and a second substrate 200 disposed oppositely to each other, and a sealant 500, spacers 300 and a solidification inhibiting layer 400, which are arranged between the first substrate 100 and the second substrate 200. The solidification inhibiting layer 400 is disposed between the sealant 500 and the spacers 300, and is configured to inhibit the spreading of the sealant 500 to the spacers 300.

Below, a spatial rectangular coordinate system is established with reference to the first substrate, to illustrate positions of individual components of the display panel in at least one of the following embodiments. Exemplarily, as shown in FIG. 1A and FIG. 1B, in this spatial rectangular coordinate system, directions of the X-axis and Y-axis are parallel to a surface of the first substrate 100 facing the second substrate 200, and direction of the Z-axis is perpendicular to a surface of the first substrate 100 facing the second substrate 200.

For example, in the direction of a plane determined by X-Y, the spacers 300, the solidification inhibiting layer 400 and the sealant 500 are arranged side by side. In this way, the sealant 500 and the spacers 300 can be spaced apart from each other by the solidification inhibiting layer 400, and in the process of packaging the display panel, the sealant 500 will not cover the spacer 300, so that structure of the display panel is optimized. In this way, the overall performance of the display panel is promoted, and yield of the display panel is increased. For example, during a cell-assembling process of the first substrate 100 and the second substrate 200, the sealant 500 will not cover the spacers 300, and yield of the cell-assembling process is increased and thus, yield of the display panel is increased.

In at least one embodiment of the present disclosure, no restriction is provided for the distribution of spacers in the display panel. Exemplarily, as shown in FIG. 1B, the display panel includes multiple spacers 300 that are spaced apart from each other. For example, the spacers 300 may be arranged in an array between the first substrate 100 and the second substrate 200.

In the display panel provided by at least one embodiment of the present disclosure, no restriction is provided for the relative position of the spacers and the solidification inhibiting layer, as long as a solidification inhibiting layer is disposed between the spacers and the sealant, the solidification inhibiting layer can play a role of preventing or reducing the spreading of the sealant to the spacers. For example, in the display panel provided by at least one embodiment of the present disclosure, on a surface of the substrate where a solidification inhibiting layer is disposed, the solidification inhibiting layer surrounds one end of each spacer. Exemplarily, as shown in FIG. 1A and FIG. 1B, at one end of each spacer 300 facing the second substrate 200, the solidification inhibiting layer 400 surrounds the spacers 300 to form a closed ring. In this way, the spreading of the sealant 500 to the spacers can be further suppressed, and yield of the display panel is further increased.

For example, in the display panel provided by at least one embodiment of the present disclosure, the sealant includes a polymerizable organic material and is cured later, and the solidification inhibiting layer is configured to inhibit the aforesaid polymerizable organic material in contact with the solidification inhibiting layer from polymerizing during solidification. During curing of material for the sealant, polymerization reaction will be created between organic molecules in the organic material, and in the region where the solidification inhibiting layer is provided, polymerization cannot occur between organic molecules. Thus, this makes the sealant not extend toward the solidification inhibiting layer or extend less, so, it will not spread toward the region where the spacers are located or spread less, that is, the solidification inhibiting layer inhibits spread of the sealant toward the spacer. In this way, in the finished display panel, as can be found, for example, by observation, the sealant material around the spacers is less than the sealant material in other positions not effected by the solidification inhibiting layer (e.g. in the middle position of spacers).

In at least one embodiment of the present disclosure, no restriction is provided for the material of the solidification inhibiting layer, and the material of the solidification inhibiting layer may be selected according to the type of organic material for the sealant, provided that the solidification inhibiting layer can hinder organic material of the sealant from being polymerized during solidification. For example, in the display panel provided by at least one embodiment of the present disclosure, the sealant may include an epoxy-based or acrylic-based organic material, or other organic material, such as a monocrystalline resin, a phenolic resin, an oxidation resin, or the like, and may further include an additive, such as a hardener, a photo-initiator, or the like, as required. For example, the sealant includes an epoxy-based organic material, and the solidification inhibiting layer includes at least one of sodium ions and potassium ions. Exemplarily, when a sealant including an epoxy-based organic material is cured by using ultraviolet light, both the sodium ions and potassium ions will hinder a polymerization reaction from being created between epoxy-based organic molecules, and this allows the epoxy-based organic material stay away from the spacers during polymerization.

Figure 2:
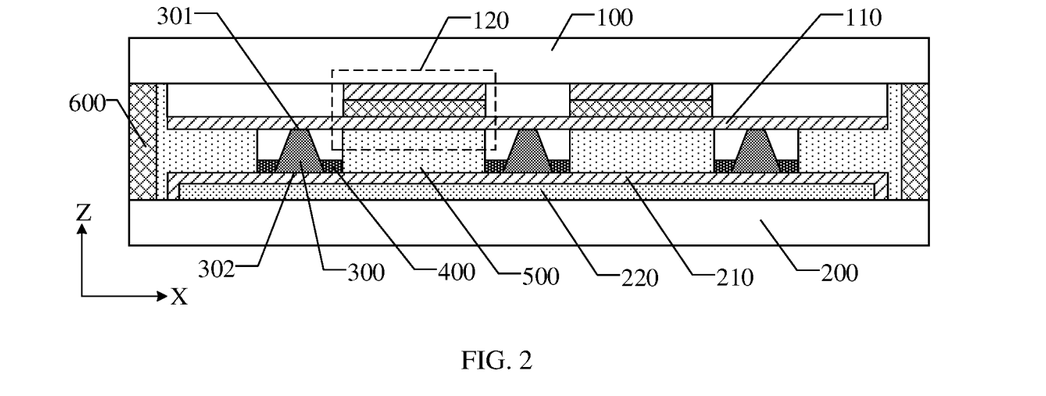
FIG. 2 is a sectional view of another display panel provided by some embodiments of the present disclosure.

FIG. 2 is a sectional view of another display panel provided by an embodiment of the present disclosure.

For example, in at least one embodiment of the present disclosure, the display panel may further include a first electrode layer on a first substrate and an auxiliary electrode layer on a side of a second substrate facing the first substrate; the spacers are configured to electrically connect the auxiliary electrode layer to the first electrode layer. Exemplarily, as shown in FIG. 2, a first electrode layer 110 is provided on a side of the first substrate 100 facing the second substrate 200, an auxiliary electrode layer 210 is provided on a side of the second substrate 200 facing the first substrate 100, and the first electrode layer 110 and the auxiliary electrode layer 210 are electrically connected by the spacers 300. In the above display panel, the solidification inhibiting layer 400 inhibits the spreading of the sealant 500 toward the spacers 300, so that the sealant 500 will not cover the spacers 300. Namely, when the display panel is encapsulated, the sealant 500 will not hinder the electrical connection between the first electrode layer 110 and the auxiliary electrode layer 210, for example, after the first substrate 100 and the second substrate 200 are cell-assembled.

In the actual process, under the restriction of the material, process and other factors, no restriction is provided for the design thickness of the first electrode layer 110, so that the resistance of the first electrode layer 110 is relatively large (its sheet resistance is large). When a voltage is applied to the first electrode layer 110, the voltage drop generated on the first electrode layer 110 is large, which has a bad effect on display effect of the display panel. For example, if the resistance of the first electrode layer 110 is too large, the brightness uniformity of the display panel will be reduced. In the above display panel, after the auxiliary electrode layer 210 is provided and the auxiliary electrode layer 210 is connected with the first electrode layer 110 in parallel, the total resistance of a component consisting of the auxiliary electrode layer 210 and the first electrode layer 110 will be less than the resistance of the first electrode layer 110. In this way, the voltage drop generated on the first electrode layer 110 is decreased. As a result, power consumption of the display panel is lowered and display effect of the display panel is enhanced.

In at least one embodiment of the present disclosure, no restriction is provided for the type of the display panel. For example, in at least one embodiment of the present disclosure, the display panel may be an organic light-emitting diode (OLED) display panel, and the display panel may further include a plurality of sub-pixel units arranged on the first substrate, and the plurality of sub-pixel units include a plurality of organic light-emitting devices. For example, each of the sub-pixel units includes one organic light-emitting device, which is an organic light-emitting diode (OLED), for example. For example, in at least one embodiment of the present disclosure, the first electrode layer may be a common driving electrode for multiple organic light-emitting devices. Exemplarily, as shown in FIG. 2, a plurality of organic light-emitting devices 120 are arranged in the display panel, and the first electrode layer 110 is a common driving electrode for the plurality of organic light-emitting devices 120. In the above display panel, the spacers 300 allow the auxiliary electrode layer 210 to be electrically connected with the first electrode layer 110. In this way, the total resistance of a component consisting of the auxiliary electrode layer 210 and the first electrode layer 110 can be less than the resistance of the first electrode layer 110. Consequently, power consumption of the display panel is lowered and display effect of the display panel is enhanced.

For example, in at least one embodiment of the present disclosure, no restriction is provided for specific structure of organic light-emitting devices. For example, each of the organic light-emitting devices may include an anode, a cathode, and an organic light-emitting functional layer provided between the anode and the cathode, and the anode or the cathode can be configured as a common driving electrode of a plurality of organic light-emitting devices. For example, the organic light-emitting functional layer in an organic light-emitting device may include a hole injection layer, a hole transportation layer, an organic light-emitting layer, an electron transportation layer, an electron injection layer, etc., and for example, it further includes a hole barrier layer, an electron barrier layer, and the like.

For example, in some embodiments of the present disclosure, organic light-emitting functional layers in a plurality of organic light-emitting devices may be disposed to be separated from each other, and for example, the organic light-emitting functional layers in the organic light-emitting devices may be configured to emit red light, blue light, green light, or white light, etc. For example, in some other embodiments of the present disclosure, a plurality of organic light-emitting devices share a same organic light-emitting functional layer, and for example, the organic light-emitting functional layer may be configured to emit white light or blue light, etc.

For example, in at least one embodiment of the present disclosure, transmittance of material for an auxiliary electrode layer is greater than that of material for a first electrode layer. Exemplarily, in at least one embodiment of the present disclosure, the first electrode layer is a cathode of an organic light-emitting device, and in the case that it is necessary for the display panel to emit light from one side of the second substrate, the cathode of the organic light-emitting device needs to be configured to be light transmissive. The cathode of the organic light-emitting device, acting as a connecting layer of negative voltage, needs to have better electrical conductivity and lower work function value, so it is usually made of metal or other conductive material, that is, the transmittance of material of the cathode is usually not good. In order to endow the cathode with good transmittance, it is necessary to reduce the design thickness of the cathode, but the sheet resistance of the cathode will be increased accordingly. In an embodiment of the present disclosure, an auxiliary electrode layer is provided and the transmittance of the material of the auxiliary electrode layer is made to be greater than that of the material of the first electrode layer. Then, the voltage drop on the first electrode layer can be lowered while the display panel is enabled to have a higher light transmittance, as compared to the case that a first electrode layer is provided alone. In this way, the display effect of the display panel is improved.

In at least one embodiment of the present disclosure, no restriction is provided on material for the first electrode layer. For example, in the case that the first electrode layer acts as an anode, the first electrode layer may be formed of a transparent conductive material with high work function, and the material of the first electrode layer may include a material selected from a group consisting of indium tin oxide (ITO), indium zinc oxide (IZO), indium gallium oxide (IGO), gallium zinc oxide (GZO), zinc oxide (ZnO), indium oxide ($In_2O_3$), aluminum zinc oxide zinc (AZO), and carbon nanotubes, etc. For example, in the case that the first electrode layer acts as a cathode, the cathode, acting as a connecting layer of negative voltage of the organic light-emitting device, possesses better electrical conductivity and lower work function value, and the first electrode layer may be made of a metallic material with low work function value, such as lithium, magnesium, calcium, strontium, aluminum, indium, etc. or an alloy of the above metallic material with low work function value and copper, gold, or silver.

For example, in at least one embodiment of the present disclosure, the auxiliary electrode layer includes a transparent conductive material. For example, the transparent conductive material may include indium tin oxide (ITO), indium zinc oxide (IZO), indium gallium oxide (IGO), gallium zinc oxide (GZO), zinc oxide (ZnO), indium oxide ($In_2O_3$), alumina zinc (AZO), and carbon nanotubes, etc. In another embodiment, the auxiliary electrode layer may also include a metallic material, so as to form a metal reticular structure, and an aperture ratio of the reticular structure is designed to get a balance between electrical conductivity and light transmittance.

For example, in the display panel provided by at least one embodiment of the present disclosure, a sealant at least partially covers organic light-emitting devices. In this way, the sealant can act to improve the stability of structure of the display panel subjected to, e.g. cell-assembling, and the sealant can protect the organic light-emitting devices, so as to prevent external water, oxygen and the like from invading into the organic light-emitting devices, and to improve display effect of the display panel.

For example, in at least one embodiment of the present disclosure, the first substrate includes a driving circuit layer, which includes a plurality of switching elements, such as thin film transistors, and the thin film transistors are connected to organic light-emitting devices so as to control the electrical function of the organic light-emitting devices. In at least one embodiment of the present disclosure, no restriction is provided for the positional relationship of the spacers, the auxiliary electrode layer and the first electrode layer, as long as the spacers can electrically connect the auxiliary electrode layer and the first electrode layer.

For example, in the display panel provided by at least one embodiment of the present disclosure, each of the spacers includes a first end electrically contacts a first electrode layer and a second end that is opposite the first end and electrically contacts an auxiliary electrode layer, and the spacers are electrically conductive, thereby electrically connecting the first electrode layer and the auxiliary electrode layer. Exemplarily, as shown in FIG. 2, the spacers 300 are arranged between the first electrode layer 110 and the auxiliary electrode layer 210, and each of the spacers 300 includes a first end 301 near the first substrate 100 and in contact with the first electrode layer 110 and a second end 302 near the second substrate 200 and in contact with the auxiliary electrode layer 210. In the case that the spacers 300 are conductive, after the first substrate 100 and the second substrate 200 are disposed oppositely to each other, and for example, after they are cell-assembled, an electric connection between the first electrode layer 110 and the auxiliary electrode layer 210 is achieved by aid of the conductive spacers 300.

In at least one embodiment of the present disclosure, in the case of the spacers being located between the first electrode layer and auxiliary electrode layer, the disposed positions of the spacers and the solidification inhibiting layer prior to, e.g. the cell-assembling process, is not restricted, for example, the spacers and the solidification inhibiting layer may be prepared on the first substrate firstly, or on the second substrate firstly.

For example, in the display panel provided by at least one embodiment of the present disclosure, in the case that the spacers are disposed between the first electrode layer and auxiliary electrode layer, the solidification inhibiting layer is disposed on the second substrate, and on a side of the auxiliary electrode layer that faces away from the second substrate. Exemplarily, as shown in FIG. 2, before the first substrate 100 and the second substrate 200 are disposed oppositely to each other (for example, before the first substrate 100 and the second substrate 200 are cell-assembled) and after an auxiliary electrode layer 210 is formed on the second substrate 200, the spacers 300 and the solidification inhibiting layer 400 may be formed on a side of the auxiliary electrode layer 210 away from the second substrate 200. After that, the first substrate 100 and the second substrate 200 are disposed oppositely, e.g., they are cell-assembled, so that the spacers 300 contact the first electrode layer 110. Consequently, an electrical connection between the first electrode layer 110 and the auxiliary electrode layer 210 is realized.

Figure 3A:
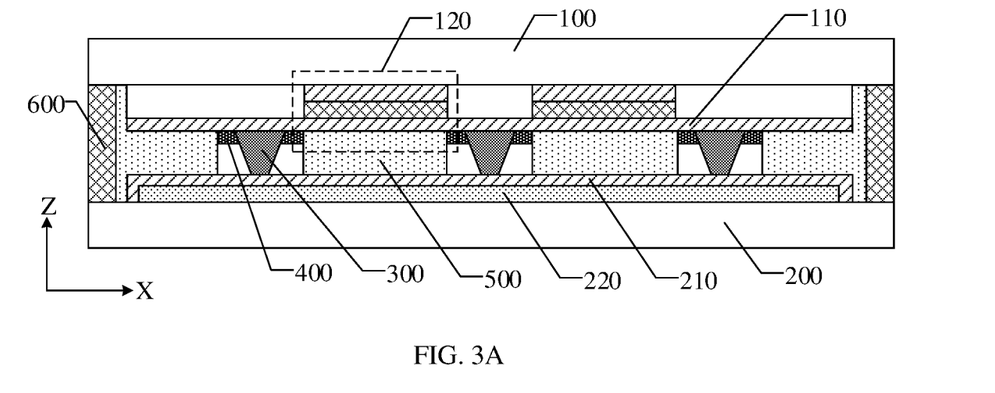
FIG. 3A is a sectional view of another display panel provided by some embodiments of the present disclosure.

FIG. 3A is a cross-sectional view of another display panel provided by an embodiment of the present disclosure.

For example, in the display panel provided by some embodiments of the present disclosure, in the case that spacers is disposed between a first electrode layer and an auxiliary electrode layer, the solidification inhibiting layer is disposed on the first substrate and on a side of the first electrode layer that faces away from the first substrate. Exemplarily, as shown in FIG. 3A, before the first substrate 100 and the second substrate 200 are disposed oppositely to each other (for example, before the first substrate 100 and the second substrate 200 are cell-assembled), and after a first electrode layer 110 is formed on the first substrate 100, spacers 300 and a solidification inhibiting layer 400 may be formed on a side of the first electrode layer 110 facing away from the first substrate 100. After that, the first substrate 100 and the second substrate 200 are disposed oppositely to each other, for example, the first substrate 100 and the second substrate 200 are cell-assembled, so that the spacers 300 contact the auxiliary electrode layer 210. Consequently, electrical connection between the first electrode layer 110 and the auxiliary electrode layer 210 is realized. For example, in the embodiment, the spacers 300 are electrically conductive.

Figure 3B:
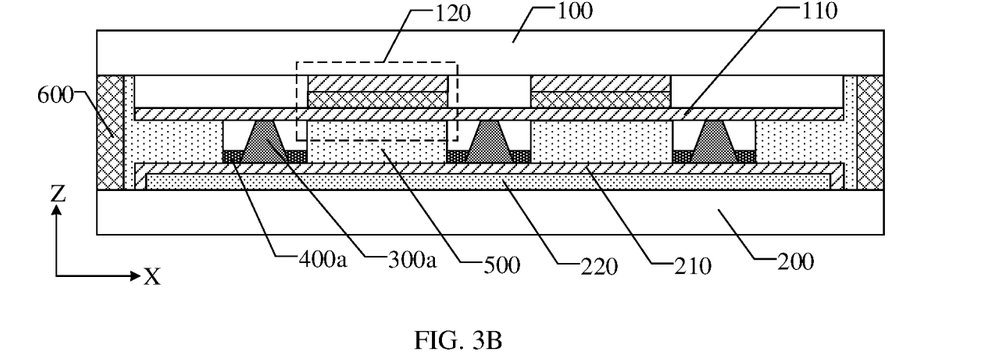
FIG. 3B is a sectional view of another display panel provided by some embodiments of the present disclosure.

For example, in the display panel provided by some other embodiments of the present disclosure, in the case that spacers is located between a first electrode layer and an auxiliary electrode layer, the solidification inhibiting layer is located on the second substrate and on a side of the auxiliary electrode layer that faces away from the second substrate. Exemplarily, as shown in FIG. 3B, before a first substrate 100 and a second substrate 200 are disposed oppositely to each other (for example, before the first substrate 100 and the second substrate 200 are cell-assembled), and after an auxiliary electrode layer 210 is formed on the second substrate 100, spacers 300a and a solidification inhibiting layer 400a may be formed on a side of the auxiliary electrode layer 110 facing away from the second substrate 100. After that, the first substrate 100 and the second substrate 200 are disposed oppositely to each other, for example, they are cell-assembled, so that the spacers 300a contact the auxiliary electrode layer 210. Consequently, electrical connection between the first electrode layer 110 and the auxiliary electrode layer 210 is realized. For example, in the embodiment, the spacers 300a are electrically conductive.

Figure 4:
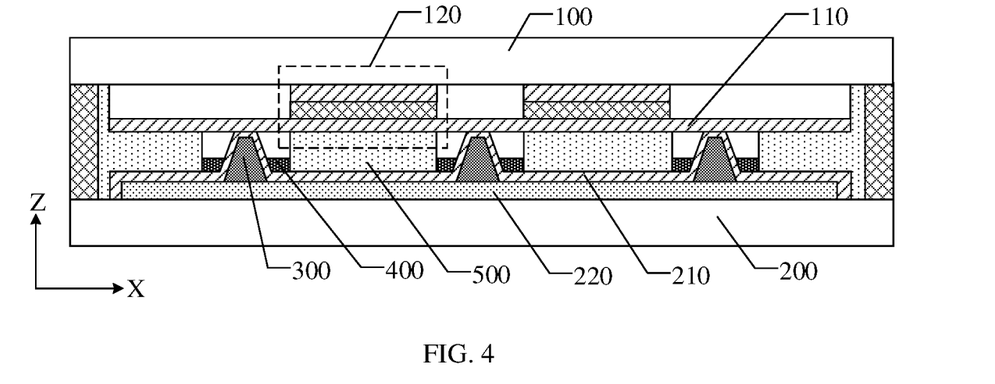
FIG. 4 is a sectional view of another display panel provided by some embodiments of the present disclosure.

FIG. 4 is a cross-sectional view of another display panel provided by an embodiment of this disclosure.

For example, in the display panel provided by at least one embodiment of the present disclosure, spacers are arranged (fixed) on a second substrate, and are disposed between an auxiliary electrode layer and the second substrate, and a portion of the auxiliary electrode layer overlapping with each of the spacers protrudes toward a first substrate to be electrically connected with the first electrode layer. Exemplarily, as shown in FIG. 4, spacers 300 are located between an auxiliary electrode layer 210 and a second substrate 200, in this way, a portion of the auxiliary electrode layer 210 overlapping with each spacer 300 will protrude toward a first substrate 100. After the first substrate 100 and the second substrate 200 are disposed oppositely to each other, for example, after they are cell-assembled, the protruding portion of the auxiliary electrode layer 210 will contact the first electrode layer 110, so as to realize electrical connection between the first electrode layer 110 and the auxiliary electrode layer 210.

For example, in the display panel provided by at least one embodiment of the present disclosure, in the case that spacers are disposed between an auxiliary electrode layer and a second substrate, the solidification inhibiting layer may be arranged on the second substrate, and it lies on a side of the auxiliary electrode layer that faces away from the second substrate. Exemplarily, as shown in FIG. 4, after formation of the spacers 300 on the second substrate 200, the auxiliary electrode layer 210 is formed on the second substrate 200, and covers the spacers 300; then, the solidification inhibiting layer 400 is formed on the auxiliary electrode layer 210. After that, the first substrate 100 and the second substrate 200 are disposed oppositely to each other, for example, they are cell-assembled, so that a portion of the auxiliary electrode layer 210 overlapping with each of the spacers 300 contacts the first electrode layer 110.

In at least one embodiment of the present disclosure, no restriction is provided on the shape of the spacers, as long as the spacers can support the space between the first substrate and the second substrates, and allows the first electrode layer to be electrically connected with the auxiliary electrode layer. For example, each spacer may be shaped as a column, or be shaped as a truncated cone, etc. For example, in at least one embodiment of the present disclosure, in the case that spacers is formed between the auxiliary electrode layer and the second substrate, the size of each spacer in a plane determined by X-Y axes gradually decreases in a direction from the proximal of the second substrate toward the distal of the second substrate. In this way, when the auxiliary electrode layer is formed on the spacers, fracture of the auxiliary electrode layer can be prevented. Exemplarily, as shown in FIG. 4, the shape of a cross-section of each spacer 300 taken along a plane determined by Z-X axes is a trapezoid, and moreover, a lower base of this trapezoid is near the second substrate 200, and an upper base of this trapezoid is far away from the second substrate 200. Exemplarily, as shown in FIG. 1B and FIG. 4, each spacer 300 employs the shape of a truncated cone, and the shape of a cross-section of each spacer 300 taken along a plane determined by Z-X axes is a trapezoid in FIG. 4.

For example, in the display panel provided by at least one embodiment of the present disclosure, in the case that spacers are disposed between an auxiliary electrode layer and a second substrate, the spacers may be conductive, i.e., each of the spacers includes a conductive material. In this way, during the manufacturing process of the display panel, even if an auxiliary electrode is broken at the spacers, the auxiliary electrode can make use of the spacers to realize its electrical connection with the first electrode layer.

In at least one embodiment of the present disclosure, no restriction is provided on material for spacers. For example, the spacers may include photoresist material, or resin material, such as polyimide, etc. For example, in the case where the spacers are conductive, the spacers may be doped with conductive particles, such as graphite particles, or metal particles, etc.

For example, in at least one embodiment of this disclosure, a color filter layer may be provided in the display panel. Exemplarily, as shown in FIG. 4, an organic light-emitting device 120 in the display panel emits light from the second substrate 200 side, and the color filter layer 220 lies on the second substrate 200. For example, the color filter layer 220 lies between the second substrate 200 and the auxiliary electrode layer 210. The color filter layer 220 may include a red color filter unit, a green color filter unit, a blue color filter unit, and so on, and these color filter units, for example, correspond to subpixel units.

It is to be noted that, in the display panel provided by at least one embodiment of the present disclosure, a color filter layer may also be provided in the display panel in the case where organic light-emitting functional layers in a plurality of organic light-emitting devices are arranged to be capable of emitting at least red light, green light, and blue light, respectively. Exemplarily, as shown in FIG. 4, lights emitted by an organic light-emitting device 120 is existing from one side of the second substrate 200, and a color filter layer 220 is arranged on the second substrate 200. For example, in the display panel, multiple sub-pixel units are provided, each of which includes one organic light-emitting device 120 therein, and the color filter units in the color filter layer 220 are in one-to-one correspondence with the organic light-emitting devices 120. In this way, the color filter layer 220 can block the incident ambient lights, thus reducing the adverse effect of ambient lights on contrast of a displayed image of the display panel; furthermore, the color filter layer 220 can filter lights emitted by adjacent organic light-emitting devices 120, to reduce the interference between sub-pixels of the display panel, and contrast of the displayed image of the display panel is further improved.

For example, in at least one embodiment of the present disclosure, a planarization layer may be arranged on a second substrate. For example, the planarization layer may be located between a color filter layer and an auxiliary electrode layer, so that the flatness of the auxiliary electrode can be improved.

For example, in at least one embodiment of this disclosure, the display panel may include a black matrix. For example, in the case where light of the display panel exists from the second substrate side, the black matrix may be arranged on the second substrate. For example, the black matrix may be located between the color filter layer and the second substrate, or on a side of the second substrate away from the first substrate.

It is to be noted that, for the sake of clear illustration, not all structures of the display panel in at least one embodiment of the present disclosure have been described. To achieve necessary functions of the display panel, those skilled in the art can provide other structures (e.g. a touch structure, etc.) based on specific application scenarios, and embodiments of the present disclosure do not limit them.

According to at least one embodiment of the present disclosure, a display device including the display panel in any of the aforementioned embodiments is also provided. For example, the display device may be any product or component with display function, such as a television, a digital camera, a mobile phone, a watch, a tablet computer, a laptop computer, a navigator, etc.

According to at least one embodiment of the present disclosure, a manufacturing method of a display panel is provided, which includes, providing a first substrate and a second substrate; forming spacers on the first substrate or the second substrate and forming a solidification inhibiting layer on a side of the spacers; applying a sealant onto the first substrate or the second substrate; arranging the first substrate and the second substrate to be opposite to each other (e.g. cell-assembling the first substrate and the second substrate), so that the sealant, the spacers and the solidification inhibiting layer are sandwiched between the first substrate and the second substrate; and curing the sealant. Here, the solidification inhibiting layer inhibits the sealant from spreading to the spacers. In the display panel obtained by using the above manufacturing method, the solidification inhibiting layer can inhibit spreading of sealant to the spacers, and in the process of encapsulating the display panel, the sealant will not cover the spacers. Namely, the sealant will not, for example, affect the contact between layers, such as structural layers or functional layers, provided on the first substrate and the second substrate, respectively. In this way, yield of the display panel is increased. For example, in a process of cell-assembling the first substrate and the second substrate, the sealant will not cover the spacers, that is, the sealant will not hinder the cell-assembling of the first substrate and the second substrate, and yield of the cell-assembling process is promoted. In this way, yield of the display panel is promoted. With regards to the structure of the display panel obtained by using the above manufacturing method, reference may be made to relevant description in the aforementioned embodiments, and no description is repeated here.

For example, the manufacturing method provided by at least one embodiment of the present disclosure further includes that, prior to opposite disposition of the first substrate and the second substrate, for example, prior to cell-assembling the first substrate and the second substrate, the sealant is solidified by using ultraviolet light. The sealant includes a polymerized organic material, and the solidification inhibiting layer inhibits the organic material in contact with it from being polymerized in the process of solidification. During solidification of material for the sealant, a polymerization reaction will be created between organic molecules in the sealant, and polymerization cannot occur between organic molecules in the region where the solidification inhibiting layer is provided, so that the sealant will not extend toward the solidification inhibiting layer or extend less. In this way, it will not spread to the region where the spacers are disposed or spread less.

For example, the manufacturing method provided by at least one embodiment of the present disclosure further includes that, the sealant is thermally cured, after the first substrate and the second substrate are disposed oppositely to each other, and for example, after they are cell-assembled. The sealant is squeezed to spread all over the space between the first substrate and the second substrate, when the first substrate and the second substrate are disposed oppositely to each other, for example, when they are cell-assembled, and thus components in the display panel are encapsulated and protected. Prior to opposite disposition of the first substrate and the second substrate, e.g., prior to cell-assembling the first substrate and the second substrate, the sealant is preliminarily cured by UV light, and the sealant is far away from the spacers, and will not spread onto the spacers when the first substrate and the second substrate are disposed oppositely to each other, e.g. when they are cell-assembled.

For example, in the manufacturing method provided by at least one embodiment of the present disclosure, a first substrate include a first electrode layer formed thereon, and a second substrate include an auxiliary electrode layer formed thereon; the first substrate and the second substrate are arranged oppositely to each other, e.g., they are cell-assembled, such that the spacers electrically connect the auxiliary electrode layer and the first electrode layer. In the display panel obtained by using the above manufacturing method, the auxiliary electrode layer is formed in parallel with the first electrode layer, which can reduce the voltage drop generated on the first electrode layer. In this way, the power consumption of the display panel is reduced and the display effect of the display panel is improved.

For example, in the manufacturing method provided by at least one embodiment of the present disclosure, spacers may be formed between a first electrode layer and an auxiliary electrode layer. Exemplarily, at one side of the first electrode layer away from the first substrate, spacers and a solidification inhibiting layer are formed, and the spacers contact the first electrode layer and are conductive. After the first substrate and the second substrate are disposed oppositely to each other, e.g. after they are cell-assembled, one end of each spacer far away from the first electrode layer contacts the auxiliary electrode layer.

For example, in the manufacturing method provided by at least one embodiment of the present disclosure, spacers may be formed between a first electrode layer and an auxiliary electrode layer. Exemplarily, spacers and a solidification inhibiting layer are formed at a side of the auxiliary electrode layer away from a second substrate, and the spacers contact the auxiliary electrode layer and are electrically conductive. After the first substrate and the second substrate are disposed oppositely to each other, e.g. after they are cell-assembled, the spacers contact the first electrode layer.

For example, in the manufacturing method provided by at least one embodiment of the present disclosure, spacers may be formed between a second substrate and an auxiliary electrode layer. Exemplary, the spacers are formed on the second substrate, next the auxiliary electrode layer is formed on the spacers, then a solidification inhibiting layer is formed on the auxiliary electrode layer, and after the first substrate and the second substrate are disposed oppositely to each other, e.g. they are cell-assembled, a portion of the auxiliary electrode layer overlapping with each of spacers protrudes toward the first substrate to be electrically connect with the first electrode layer.

It is to be noted that, with regard to structure of the display panel obtained according to the above manufacturing method, reference may be made to the relevant description in the aforementioned embodiments (e.g. embodiments shown in FIG. 1A to FIG. 4), and no description is repeated here.

Below, the manufacturing method of the display panel in at least one embodiment of this disclosure will be described with reference to the manufacturing process of the display panel shown in FIG. 4 as an example. Exemplarily, as shown in FIG. 5A to FIG. 5E and FIG. 4, the process of manufacturing method of the display panel provided by at least one embodiment of the present disclosure is as follows.

Figure 5A:
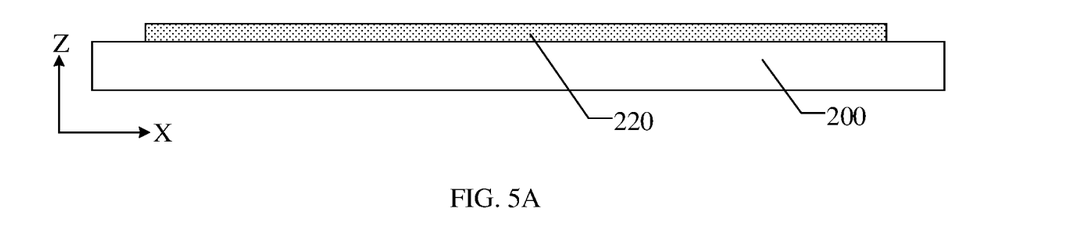
FIG. 5A to FIG. 5E are diagrams of the process of a method of manufacturing a display panel provided by some embodiments of the present disclosure.

As shown in FIG. 5A, a second substrate 200 is provided and a color filter layer 220 is formed on the second substrate 200.

For example, the second substrate may be a flexible substrate or a rigid substrate, and the second substrate may be a transparent substrate. Material of the flexible substrate may include an organic resin type material, such as a polyimide-type material, polyethylene terephthalate (PET), polymethyl methacrylate (PMMA), etc. Material of the rigid substrate may include glass, polyethylene terephthalate (PET), polymethyl methacrylate (PMMA), etc.

A color filter layer 220 may be formed, for example, by using a color resin and by a patterning process. For example, in the case that the color filter layer 220 includes red, green, and blue color filter units in parallel to each other, a red resin layer may be formed firstly, and the red resin layer is patterned to form the red color filter units, next, a green resin layer may be formed, and the green resin layer is patterned to form the green color filter units, and then, a blue resin layer may be formed, and the blue resin layer is patterned to form the blue color filter units.

Figure 5B:
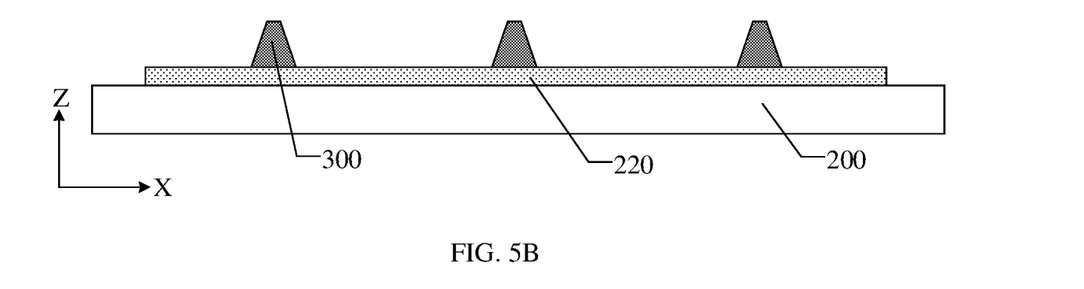

As shown in FIG. 5A to FIG. 5B, spacers 300 are formed on the second substrate 200. For example, the spacers 300 may be formed by a patterning process. For example, the material forming the spacers 300 may be a conductive material.

For example, in at least one embodiment of the present disclosure, the patterning process may be a photolithographic patterning process, which may include, for example, applying a photoresist on a structural layer to be patterned, exposing the photoresist with a mask, developing the exposed photoresist to obtain a photoresist pattern, etching the structural layer using the photoresist pattern, and then optionally removing the photoresist pattern. It is to be noted that, if a structural layer to be patterned already includes a photoresist, no photoresist applying process is needed anymore.

Figure 5C:
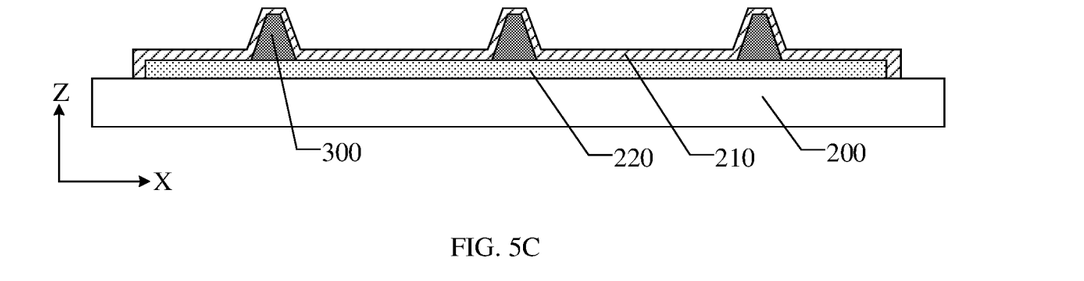

As shown in FIG. 5B to FIG. 5C, a thin film of a conductive material is deposited on a second substrate 200 to form an auxiliary electrode layer 210. The auxiliary electrode layer 210 overlaps at least partially with the spacers 300, and for example, furthermore, the auxiliary electrode layer 210 covers the spacers 300. In the region where spacers 300 is formed, the auxiliary electrode layer 210 include a protruding portion away from the second substrate 200.

Figure 5D:
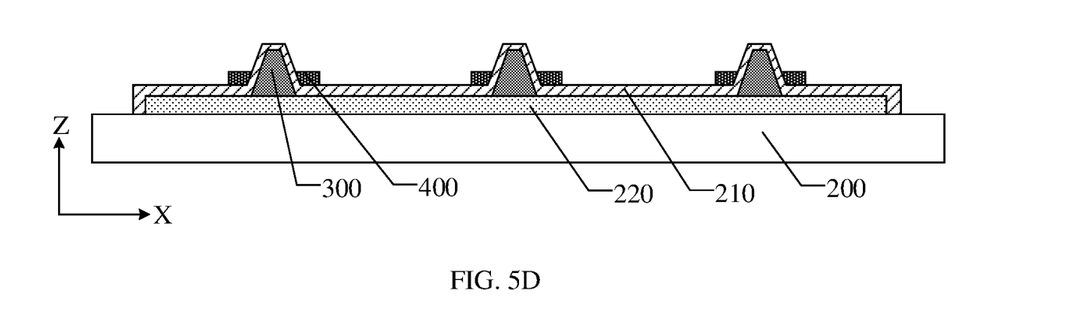

As shown in FIG. 5C to FIG. 5D, a thin film including sodium ions or potassium ions is deposited or coated on the second substrate 200, and the thin film is patterned to form a solidification inhibiting layer 400. For example, at one end of each spacer 300 facing the second substrate 200, the solidification inhibiting layer 400 surrounds the spacers 300 to form a closed ring.

Figure 5E:
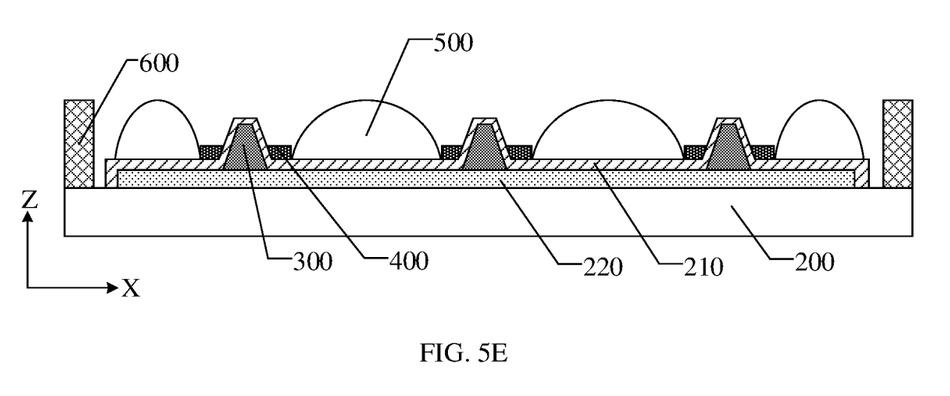

As shown in FIG. 5D to FIG. 5E, a sealant 500 is applied onto the second substrate 200, and then it is preliminarily cured by using ultraviolet light. For example, sealant 500 includes an epoxy-type organic material. When the UV-light is used to cure the sealant 500 including the epoxy-type organic material, the solidification inhibiting layer including sodium ions and potassium ions will hinder a polymerization reaction from being created between epoxy-type organic molecules, so that the epoxy-type organic material in the sealant 500 stays away from the spacers 300 in the polymerization process.

For example, a frame sealant 600 may be formed on the periphery of the second substrate 200. The frame sealant 600 can prevent the sealant 500 from overflowing, and moreover, it can be used for further encapsulation of the display panel in the subsequent process.

As shown in FIG. 5E to FIG. 4, a first substrate 100 is provided, and the first substrate 100 and the second substrate 200 are disposed oppositely to each other, e.g., they are cell-assembled. During the cell-assembling of the first and second substrate, the sealant 500 is squeezed to fill the space between the first substrate 100 and the second substrate 20, and then the sealant 500 is thermally cured, so that the sealant 500 acts to stick the first substrate 100 and the second substrate 200 together. For example, in a cell-assembling process of the first substrate 100 and the second substrate 200, a Vacuum Align System (VAS) may be used for press-bonding. For example, during the above thermal curing, the frame sealant 600 can be cured at the same time.

Here, for the material of the first substrate, reference may be made to the description of the second substrate in the aforementioned embodiment, and no description is repeated. For example, in at least one embodiment of the present disclosure, each of the first substrate and the second substrate is a rigid substrate, or each of them is a flexible substrate.

For example, in at least one embodiment of the present disclosure, one of first and second substrates is a transparent substrate.

It is to be noted that, in the process shown in FIG. 5E to FIG. 4, the first electrode layer 110 and other components may be formed on the supplied first substrate 100. For the type of components formed on the first substrate 100, reference may be made to the relevant description in the aforementioned embodiments (e.g., embodiments shown in FIG. 2 to FIG. 4), and no description is repeated here.

At least one embodiment of the present disclosure provides a display panel and its manufacturing method, and a display device, and at least one of the following beneficial effects may be possessed:

(1) In the display panel provided by at least one embodiment of the present disclosure, the solidification inhibiting layer can inhibit spreading of the sealant toward spacers so that the sealant will not hinder the cell-assembling of the first substrate and the second substrate, for example, and yield of the cell-assembling process is promoted. In this way, yield of the display panel is promoted.

(2) In the display panel provided by at least one embodiment of the present disclosure, the auxiliary electrode layer is arranged on the second substrate, and spacers are configured to allow the auxiliary electrode layer to be electrically connected with the first electrode layer on the first substrate. In this way, it is possible that the voltage drop generated on the first electrode layer is lowered, the power consumption of the display panel is reduced and the display effect of the display panel is enhanced.

(3) In the display panel provided by at least one embodiment of the present disclosure, transmittance of material of the auxiliary electrode layer is greater than that of material of first electrode layer. It is possible that the voltage drop on the first electrode layer is lowered while the display panel is enabled to have a higher light transmittance, and the display effect of the display panel is improved.

The following points should be noted.

(1) The accompanying drawings involve only the structure(s) in connection with the embodiment(s) of the present disclosure, and other structure(s) refer to common design(s).

(2) To clarity, in the drawings used to describe the embodiments of the present disclosure, a thickness of a layer or a region may be enlarged or thinned, that is, the drawings are not drawn as actual scales.

(3) Without conflict with each other, embodiments and elements in embodiments of the present disclosure can be combined to obtain new embodiment(s).

The above description is only the specific embodiments of the present disclosure, and the scope of the present disclosure is not limited thereto. The scope of the present disclosure is defined by the claims.

What is claimed is:

1. A display panel, comprising
a first substrate and a second substrate provided oppositely to each other, and
a sealant, spacers, and a solidification inhibiting layer between the first substrate and the second substrate;
wherein the solidification inhibiting layer is provided between the sealant and each of the spacers, and is configured to surround each of the spacers to inhibit spreading of the sealant to the spacers, and the sealant includes an epoxy-based organic material, and the solidification inhibiting layer includes at least one of sodium ions and potassium ions.

2. A method of manufacturing a display panel, comprising,
providing a first substrate and a second substrate;
forming a first electrode layer on the first substrate;
forming spacers on the second substrate;
forming an auxiliary electrode layer to cover the second substrate;
forming a solidification inhibiting layer around each of the spacers;
applying a sealant onto the first substrate or the second substrate;

arranging the first substrate and the second substrate to be opposite to each other, so that the sealant, first electrode layer, the auxiliary electrode layer, the spacers and the solidification inhibiting layer are sandwiched between the first substrate and the second substrate;

curing the sealant, wherein the solidification inhibiting layer is formed on the first electrode layer or on the auxiliary electrode layer and between the sealant and each of the spacers, and the solidification inhibiting layer is configured to surround each of the spacers to inhibit spreading of the sealant to the spacers, and the sealant includes an epoxy-based organic material, and the solidification inhibiting layer includes at least one of sodium ions and potassium ions.

3. The manufacturing method according to claim 2, further comprising, curing the sealant with ultraviolet light before the first substrate and the second substrate are arranged oppositely to each other.

4. The manufacturing method according to claim 3, further comprising, thermally curing the sealant, after the first substrate and second substrate are arranged oppositely to each other.

5. The manufacturing method according to claim 2, wherein the first substrate and the second substrate are arranged to be opposite to each other, so that the spacers electrically connect the auxiliary electrode layer and the first electrode layer.

6. The manufacturing method according to claim 5, wherein the spacers and the solidification inhibiting layer are formed on one side of the first electrode layer away from the first substrate, the spacers are in contact with the first electrode layer and are electrically conductive, and after the first substrate and the second substrate are arranged oppositely to each other, one end of each spacer away from the first electrode layer contacts the auxiliary electrode layer; or the spacers and the solidification inhibiting layer are formed on one side of the auxiliary electrode layer away from the second substrate, each of the spacers contacts the auxiliary electrode layer and is electrically conductive, and after the first substrate and the second substrate are arranged oppositely to each other, each of the spacers contacts the first electrode layer; or the spacers are formed on the second substrate, next the auxiliary electrode layer is formed on the spacers, the solidification inhibiting layer is then formed on the auxiliary electrode layer, and after the first substrate and the second substrate are arranged oppositely to each other, a part of the auxiliary electrode layer overlapping with each of the spacers protrudes toward the first substrate to be electrically connected with the first electrode layer.

* * * * *